(12) United States Patent  
Tamura et al.

(10) Patent No.: US 10,224,230 B2  
(45) Date of Patent: Mar. 5, 2019

(54) SURFACE PROTECTIVE SHEET

(71) Applicant: LINTEC Corporation, Tokyo (JP)

(72) Inventors: Kazuyuki Tamura, Tokyo (JP); Shigeto Okuji, Tokyo (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 15/520,121

(22) PCT Filed: Oct. 21, 2015

(86) PCT No.: PCT/JP2015/079724  
§ 371 (c)(1),  
(2) Date: Apr. 19, 2017

(87) PCT Pub. No.: WO2016/063916  
PCT Pub. Date: Apr. 28, 2016

(65) Prior Publication Data  
US 2017/0323820 A1 Nov. 9, 2017

(30) Foreign Application Priority Data

Oct. 23, 2014 (JP) .................. 2014-216541

(51) Int. Cl.  
*H01L 21/683* (2006.01)  
*B32B 27/00* (2006.01)  
(Continued)

(52) U.S. Cl.  
CPC ............ *H01L 21/6835* (2013.01); *B32B 7/04* (2013.01); *B32B 25/08* (2013.01); *B32B 25/14* (2013.01); *B32B 27/00* (2013.01); *B32B 27/08* (2013.01); *B32B 27/16* (2013.01); *B32B 27/18* (2013.01); *B32B 27/20* (2013.01); *B32B 27/304* (2013.01); *B32B 27/308* (2013.01); *B32B 27/32* (2013.01); *B32B 27/38* (2013.01); *B32B 27/40* (2013.01); *C09J 7/20* (2018.01); *C09J 7/25* (2018.01);  
(Continued)

(58) Field of Classification Search  
None  
See application file for complete search history.

(56) References Cited

U.S. PATENT DOCUMENTS

2006/0043532 A1* 3/2006 Senoo ................. H01L 21/6835  
257/618

FOREIGN PATENT DOCUMENTS

JP S60-196956 A 10/1985  
JP S60-223139 A 11/1985  
(Continued)

OTHER PUBLICATIONS

International Search Report for PCT/JP2015/079724 dated Jan. 12, 2016.  
(Continued)

*Primary Examiner* — Jiong-Ping Lu  
(74) *Attorney, Agent, or Firm* — Cahn & Samuels, LLP

(57) ABSTRACT

A surface protective sheet is used when grinding the rear surface of a semiconductor wafer having a circuit formed on the front surface, and is provided with: a base material comprising a support film and an antistatic coating layer which includes an inorganic conductive filler and a cured product of a curable resin (A); and an adhesive layer. The stress relaxation percentage of the base material after 1 minute at 10% elongation is at least 60%. The Young's modulus of the base material is 100-2000 MPa.

11 Claims, 1 Drawing Sheet

(51) Int. Cl.
    *B32B 27/18*     (2006.01)
    *H01L 21/304*     (2006.01)
    *C09J 7/29*     (2018.01)
    *C09J 7/20*     (2018.01)
    *C09J 7/38*     (2018.01)
    *G06K 19/077*     (2006.01)
    *C09J 7/25*     (2018.01)
    *B32B 7/04*     (2019.01)
    *B32B 25/08*     (2006.01)
    *B32B 25/14*     (2006.01)
    *B32B 27/08*     (2006.01)
    *B32B 27/16*     (2006.01)
    *B32B 27/20*     (2006.01)
    *B32B 27/30*     (2006.01)
    *B32B 27/32*     (2006.01)
    *B32B 27/38*     (2006.01)
    *B32B 27/40*     (2006.01)

(52) U.S. Cl.
CPC . *C09J 7/29* (2018.01); *C09J 7/38* (2018.01); *G06K 19/077* (2013.01); *H01L 21/304* (2013.01); *H01L 21/683* (2013.01); *H01L 21/6836* (2013.01); *B32B 2250/02* (2013.01); *B32B 2250/24* (2013.01); *B32B 2255/10* (2013.01); *B32B 2255/26* (2013.01); *B32B 2264/10* (2013.01); *B32B 2264/102* (2013.01); *B32B 2264/104* (2013.01); *B32B 2264/105* (2013.01); *B32B 2307/202* (2013.01); *B32B 2307/21* (2013.01); *B32B 2307/4026* (2013.01); *B32B 2307/50* (2013.01); *B32B 2307/732* (2013.01); *B32B 2307/748* (2013.01); *B32B 2457/14* (2013.01); *C08K 2201/001* (2013.01); *C09J 2201/602* (2013.01); *C09J 2201/622* (2013.01); *C09J 2203/326* (2013.01); *C09J 2205/102* (2013.01); *C09J 2463/006* (2013.01); *C09J 2475/006* (2013.01); *H01L 2221/6834* (2013.01); *H01L 2221/68327* (2013.01)

(56) References Cited

FOREIGN PATENT DOCUMENTS

| JP | S63-153814 A | 6/1988 | |
|---|---|---|---|
| JP | H06-101455 B2 | 12/1994 | |
| JP | H08-245932 A | 9/1996 | |
| JP | H08245932 * | 9/1996 | ............... B32B 7/10 |
| JP | 2000-150432 A | 5/2000 | |
| JP | 2007-296751 A | 11/2007 | |
| JP | 2010-177542 A | 8/2010 | |
| JP | 2012-097188 A | 5/2012 | |

OTHER PUBLICATIONS

English Abstract of JP 2010-177542.
English Abstract of JP H08-245932.
English Abstract of JP 2007-296751.
English Abstract of JP 2012-097188.
English Abstract of JP S60-196956.
English Abstract of JP S60-223139.
English Abstract of JP S63-153814.
English Abstract of JP H05-77284.
English Abstract of JP H06-101455.
English Abstract of JP 2000-150432.
International application No. PCT/JP2015/079724, International Preliminary Report on Patentability, dated May 4, 2017.

* cited by examiner

SURFACE PROTECTIVE SHEET

This application is a U.S. national stage application of PCT/JP2015/079724 filed on 21 Oct. 2015 and claims priority to Japanese patent document 2014-216541 filed on 23 Oct. 2014, the entireties of which are incorporated herein by reference.

TECHNICAL FIELD

The present invention relates to a surface protective sheet used for protecting a circuit pattern by temporary adhering to a surface during a backside grinding of a semiconductor wafer formed with a circuit on the surface.

BACKGROUND OF THE INVENTION

Recently, along with the electronic devices becoming more compact and highly integrated, a semiconductor chip which is a constitution member of the electronic devices has become thinner. Therefore, the conventional thickness of the wafer was 350 μm or so, however it is demanded to be as thin as 50 to 100 μm, or even thinner than this.

The backside grinding of the wafer after forming the circuit pattern on the semiconductor wafer surface has been done conventionally. Here, the adhesive sheet called surface protective sheet is adhered on the circuit face to protect the circuit face and to fix the wafer, and then the backside grinding is carried out. When grinding, in order to remove the grinding dust and the heat generated, generally water is sprayed to the grinding face of the wafer.

Conventionally, for the surface protective sheet, the adhesive sheet is used which is formed by coating the adhesive agent on the base. The patent document 1 prevents the wafer from curving after the backside grinding by using the surface protective sheet having high stress relaxation rate.

PRIOR ART

[Patent Article 1] JP Patent Application Laid Open No. 2000-150432

However, when the backside grinding of the wafer is done using the surface protective sheet of the patent document 1, the static is generated due to the release charge when the surface protective sheet is released from the wafer; thereby the circuit formed on the surface of the wafer is damaged in some cases. Recently, very fine and highly densified wires are formed on the circuit formed on the wafer surface, thus the static generated by the release charge is a particular problem.

As the means to prevent such static caused by the release charge, the surface protective sheet may be formed with the anti-static coat layer. However, in reality, sufficient anti-static ability was not obtained.

The object of the present invention is to provide the surface protective sheet capable of suppressing the wafer from curving after the sheet release, and having sufficient anti-static ability.

In order to attain the above object, the present invention includes the following gist.

[1] A surface protective sheet used for a backside grinding of a semiconductor wafer formed with a circuit on a surface, wherein said surface protective sheet comprises an adhesive layer, and a base comprising a support film and an anti-static coat layer including an inorganic conductive filler and a cured product of a curable resin (A), a stress relaxation rate of the base after 1 minute of 10% stretch is 60% or more, and a Young's modulus of the base is 100 to 2000 MPa.

[2] The surface protective sheet as set forth in [1], wherein the anti-static coat layer comprises 150 to 600 parts by weight of the inorganic conductive filler with respect to 100 parts by weight of the cured product of the curable resin (A).

[3] The surface protective sheet as set forth in [1] or [2], wherein the support film includes a cured product of a curable resin (B).

[4] The surface protective sheet as set forth in [3], wherein the curable resin (B) is an energy ray curable urethane resin.

[5] A production method of a surface protective sheet comprising steps of forming, a pre-cured layer by coating and pre-curing a compound including a curable resin (B), a coat layer by coating a compound including an inorganic conductive filler and a curable resin (A) on the pre-cured layer, and a base by curing the pre-cured layer and the coat layer.

According to the surface protective sheet of the present invention, the wafer is suppressed from curving after sheet release, and the static caused by the release charge can be suppressed, and the damage to the wafer circuit by the static can be prevented.

DETAILED DESCRIPTION OF INVENTION

Figure 1:
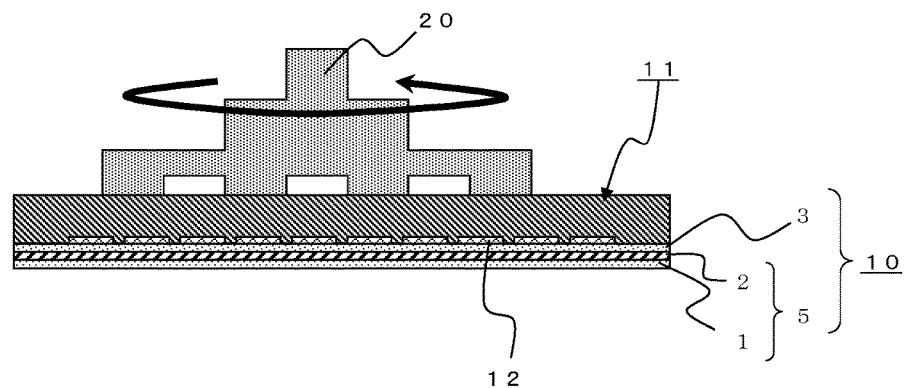
FIG. 1 is the cross section while the surface protective sheet according to the present invention is adhered to the semiconductor wafer.

Hereinafter, the present invention will be described in further detail including the best mode thereof. As shown in FIG. 1, the surface protective sheet 10 according to the present invention is used when carrying out the backside grinding of the semiconductor wafer 11 formed with the circuit 12 on the surface; and the surface protective sheet 10 comprises the adhesive layer 3, and the base 5 comprising the support film 2 and the anti-static coat layer 1 comprising the inorganic conductive filler and the cured product of the curable resin (A), further the stress relaxation rate of the base after 1 minute of 10% stretch is 60% or more, and the Young's modulus is 100 to 2000 MPa.

(Base)

The base used for the surface protective sheet of the present invention comprises the anti-static coat layer and the support film. Hereinafter, the anti-static coat and the support film will be described in this order.

(Anti-Static Coat Layer)

The anti-static coat layer is formed to coat one side or both sides of the support film which will be described in below. By providing the anti-static coat layer, the static is effectively dispersed which is caused by the release charge when releasing the surface protective sheet according to the present invention from the adherend (for example, the semiconductor wafer and the semiconductor chip or so), thereby the anti-static ability is enhanced. The anti-static coat layer comprises the inorganic conductive filler and the cured product of the curable resin (A), and it can be obtained by the method of curing the compound including the inorganic conductive filler and the curable resin (A).

The inorganic conductive filler is not particularly limited, and for example a metal filler such as Cu, Al, Ni, Sn, and Zn or so, and a metal oxide filler such as zinc oxide based, titanium oxide based, tin oxide based, indium oxide based, antimony oxide based or so may be mentioned. Among these, the metal oxide filler of tin oxide based is preferable because it is relatively inexpensive and can be used for general-purpose use. As the tin oxide based metal oxide filler, specifically, antimony doped tin oxide (ATO), phosphorous doped tin oxide (PTO) or so can be used.

The average particle diameter of the inorganic conductive filler is not particularly limited, and preferably it is 0.01 to 1 μm, and more preferably 0.02 to 0.5 μm. The average particle diameter is the value measured by the particle size distribution measurement device (MICROTRACK UPA-150 made by NIKKISO Group).

The anti-static coat layer preferably comprises 150 to 600 parts by weight, more preferably 200 to 600 parts by weight and particularly preferably 220 to 600 parts by weight of the inorganic conductive filler with respect to 100 parts by weight of cured product of the curable resin (A). Note that, usually the blending ratio between the curable resin (A) before the curing and the inorganic conductive filler is not substantially different from the blending ratio of the cured product of the curable resin (A) and the inorganic conductive filler. Therefore, in the present invention, the blending ratio between the curable resin (A) before the curing and the inorganic conductive filler is considered as the blending ratio of the cured product of the curable resin (A) and the inorganic conductive filler. By setting the content of the inorganic conductive filler in the anti-static coat layer within the above mentioned range, excellent anti-static ability can be exhibited, and also during the step of processing the semiconductor wafer, the anti-static coat layer is prevented from having a crack, and as a result, it efficiently prevents the anti-static ability from decreasing.

The curable resin (A) is not particularly limited, however the energy ray curable resin, heat curable resin or so can be used, and preferably the energy ray curable resin is used.

The energy ray curable resin is not particularly limited, and for example the resin composition using oligomer based energy ray curable resin such as energy ray polymerizable urethane (meth)acrylate oligomer or epoxy (meth)acrylate oligomer or so is preferably used. The weight average molecular weight Mw (in terms of polystyrene measured by gel permeation chromatography) of the urethane (meth)acrylate oligomer and epoxy (meth)acrylate oligomer is usually 1000 to 70000 or so, and preferably 1500 to 60000. The above mentioned urethane (meth)acrylate oligomer and epoxy (meth)acrylate oligomer may be used alone, or it may be used by combining two or more thereof.

When the content of the oligomer based energy ray curable resin is increased in the energy ray curable resin, the adhesiveness with the support film which will be described in below may decrease. Thus, in order to enhance the adhesiveness with the support film, a binder component may be added to the component of the curable resin (A). As such binder component, acrylic resin, polyester resin, urethane resin, polyamide resin or so may be mentioned.

Also, the energy ray curable resin may be a polymer comprising an energy ray curable functional group at the side chain. By using such polymer as the energy ray curable resin, the adhesiveness with the support film can be enhanced without compromising the crosslinking density. For example, such polymer comprises the acrylic polymer as the main chain, and comprises an epoxy group and an energy ray curable double bond as the functional group at the side chain.

By mixing the photopolymerization initiator to the energy ray curable resin, the polymerization curing time and the irradiation amount of the energy ray irradiation can be lowered. As the photopolymerization initiator, benzoin compound, acetophenone compound, acylphosphinoxide compound, titanocene compound, thioxanthone compound, peroxide compound or so, a photosensitizer such as amine or quinone or so may be mentioned; and specifically 1-hydroxycyclohexylphenyl ketone, 2-hydroxy-2-methyl-1-phenylpropane-1-one, benzoin, benzoin methylether, benzoin ethylether, benzoin isopropylether or so may be mentioned.

Also, in the curable resin (A), in order to improve the dispersibility of the inorganic conductive filler in the resin, a dispersant may be blended. Also, other additive such as pigment and dye or so may be added as well.

The anti-static coat layer can be formed by coating and curing the compound including the inorganic conductive filler and the curable resin (A) directly on the support film which will be described in below. Also, a liquid state of the compound including the inorganic conductive filler and the curable resin (A) may be casted as thin layer on the casting film, then further thereon, the compound including the curable resin (B), which will be described in below, can be casted, thereby the base comprising the anti-static coat layer and the support film can be obtained. The order of performing the curing here may be immediately after coating each of those, or it may be done at once after coating the base.

The thickness of the anti-static coat layer is preferably 0.2 to 5 μm, and preferably 0.5 to 5 μm, and particularly preferably 1 to 4 μm. By setting the thickness of anti-static coat layer within such range, a high anti-static ability tends to be maintained.

Also, the surface resistivity of the anti-static coat layer is preferably $1\times10^{12}$ Ω/sq. or less, more preferably $1\times10^{11}$ Ω/sq. or less, and particularly preferably $1\times10^{10}$ Ω/sq. or less. When the surface resistivity exceeds $1\times10^{12}$ Ω/sq., in case of releasing the surface protective sheet of the present invention from the adherend, it may become difficult to stably suppress the static. By setting the surface resistivity of the anti-static coat layer within the above range, the anti-static ability of the surface protective sheet can be improved. The surface resistivity of the anti-static coat layer can be measured by first obtaining the sample by cutting the anti-static coat layer to 100 mm×100 mm, and humidifying the sample for 24 hours under the condition of 23° C. and the average humidity of 50% RH, and then measuring the resistivity of the surface thereof in accordance with JIS K 6911; 1995.

(Support Film)

The support film used for the surface protective sheet of the present invention is not particularly limited as long as it is a resin sheet, and various resin sheets can be used. As such resin sheet, for example the resin film of polyolefin, polyvinyl chloride, acrylic rubber and urethane or so may be mentioned. The support film may be single layer, or it may be multiple layers. Also, it may be a film carried out with the crosslinking treatment.

As such support film, the thermoplastic resin formed into a sheet by extrusion molding may be used, or the film comprising the cured product obtained by forming a thin film and curing the curable resin (B) by predetermined means may be used. When the film comprising the cured product of the curable resin (B) is used as the support film, the stress relaxation rate and the Young's modulus of the base can be controlled easily, and also the adhesiveness with the anti-static coat layer can be improved.

The curable resin (B) is not particularly limited, but as similar to the curable resin (A) used for the anti-static coat layer, the energy ray curable resin, heat curable resin or so can be used, and preferably the energy ray curable resin is used. The energy ray curable resin is not particularly limited, but for example, the energy ray curable urethane resin can be used. The supporting film including the cured product of the energy ray curable urethane resin has excellent stress relaxation property, and the stress relaxation rate of the base can be easily controlled within said range thus it is preferable.

As the energy ray curable urethane resin, the energy ray curable resin comprising urethane (meth)acrylate resin and urethane polymer or so, and the energy ray polymerizable monomer as the main component may be mentioned.

The urethane (meth)acrylate resin is a compound including the urethane (meth)acrylate oligomer, and if necessary, the compound comprising thiol group in the molecule, and N-nitrosamine based polymerization inhibitor and/or N-oxyl based polymerization inhibitor may be included.

The urethane (meth)acrylate oligomer is the compound comprising (meth)acryloyl group and urethane bond. Such urethane (meth)acrylate oligomer can be obtained by reacting (meth)acrylate comprising the hydroxyl group with the terminal isocyanate urethane prepolymer which is obtained by reacting a polyol compound and a polyvalent isocyanate compound. Note that, in the present specification, (meth) acrylate refers to both acrylate and methacrylate.

The polyol compound is not particularly limited as long as it comprises two or more of the hydroxyl groups and known polyol compound can be used. Specifically, for example, it may be any of alkylene diol, polyether type polyol, polyester type polyol, polycarbonate type polyol, however by using the polyether type polyol, further enhanced effect can be obtained. Also, as long as it is polyol it is not particularly limited, and it may be bifunctional diol, trifunctional triol, and polyol of tetrafunctional or more, however from the point of easiness to obtain, general purpose use, and reactivity, it is particularly preferable to use diol. Among these, polyether type diol is preferably used.

The polyether type diol which is a representative example of the polyether type polyol is generally shown as HO—(—R—O-)n-H. Here, R is a divalent hydrocarbon group, preferably alkylene group, more preferably of the alkylene group having a carbon atom of 1 to 6, and particularly preferably of the alkylene group having carbon atoms of 2 or 3. Also, among the alkylene group having the carbon atom of 1 to 6, ethylene, propylene, or tetramethylene is preferable, and ethylene or propylene is particularly preferable. Therefore, as the particularly preferable polyether type diol, polyethylene glycol, polypropylene glycol, polytetramethylene glycol or so may be mentioned; and as further particularly preferable polyether type diol, polyethylene glycol and polypropylene glycol may be mentioned. "n" is the number of repeat of "R", and preferably it is 10 to 250 or so, more preferably 25 to 205 or so, and particularly preferably it is 40 to 185. If "n" is smaller than 10, the urethane bond concentration of urethane (meth)acrylate oligomer increases, and the resilience of the support film increases, which may cause excessive increase of the Young's modulus of the base in the present invention. If "n" is larger than 250, the mutual reaction between the polyether chains against each other may become stronger, and this may cause the Young's modulus to exceed the upper limit.

The reaction between the polyether type diol and the polyvalent isocyanate compound generates the terminal isocyanate urethane prepolymer which is introduced with ether bond part (—(—R—O-)n-). By using such polyether type diol, urethane (meth)acrylate oligomer comprises the constitution unit derived from polyether type diol.

The polyester type polyol is obtained by polycondensation of a polyol compound and a polybasic acid component. As the polyol compound, various known glycols such as ethylene glycol, diethylene glycol, triethylene glycol, 1,2-propane diol, 1,3-propane diol, 1,3-butane diol, 1,4-butane diol, neopentyl glycol, pentane diol, 3-methyl-1,5-pentane diol, 2,2,4-trimethyl-1,3-pentane diol, hexane diol, octane diol, 2,2-diethyl-1,3-propane diol, 2-ethyl-2-butyl-1,3-propane diol, 1,4-cyclohexane dimethanol, and ethylene glycol or propylene glycol additives of bisphenol A or so may be mentioned. As the polybasic acid component used for the production of the polyester type polyol, variously known as the polybasic acid component of polyester can be used. Specifically, for example, dibasic acids such as adipic acid, maleic acid, succinic acid, oxalic acid, fumaric acid, malonic acid, glutaric acid, pimelic acid, azelaic acid, sebacic acid, suberic acid or so; aromatic polybasic acids; and anhydrides and derivatives thereof, dimer acids and hydrogenated dimer acids corresponding to said dibasic acids and polybasic acids may be mentioned. Note that, in order to provide suitable hardness to the coated layer, the aromatic polybasic acid is preferably used. As the aromatic polybasic acids, for example, dibasic acids such as phthalic anhydride, isophthalic acid, terephthalic acid, 2,6-naphthalene dicarboxylic acid or so; polybasic acids such as trimellitic acid, pyromellitic acid or so; and acid anhydride and the derivative thereof or so may be mentioned. Note that, for esterification reaction, various known catalysts may be used if necessary. As the catalyst, for example tin compounds such as dibutyl tin oxide, tin 2-ethylhexanoate or so; and alkoxy titanium such as tetrabutyl titanate, and tetrapropyl titanate or so may be mentioned.

The polycarbonate type polyol is not particularly limited, and those already known can be used. Specifically, for example, the reaction product between the aforementioned glycols and alkylene carbonate compound may be mentioned.

As the molecular weight of the polyol compound, 500 to 10000 or so is preferable, and 800 to 8000 or so is more preferable. If the molecular weight is lower than 500, the urethane bonding concentration of urethane (meth)acrylate oligomer increases, and the Young's modulus of the base of the present invention may be increased. If the molecular weight is too much, the mutual reactions between the polyether chains against each other becomes strong, which may cause the Young's modulus to exceed the upper limit.

Note that, the molecular weight of the polyol compound is calculated from polyol functional group number×56.11×1000/hydroxyl value [mgKOH/g] which is the hydroxyl value of the polyol compound.

As the polyvalent isocyanate compound, aliphatic polyisocyanates such as tetramethylene diisocyanate, hexamethylene diisocyanate, trimethylhexamethylene diisocyanate or so; aliphatic diisocyanates such as isophorone diisocyanate, norbornane diisocyanate, dicyclohexylmethane-4,4'-diisocyanate, dicyclohexylmethane2,4'-diisocyanate, ω,ω'-diisocyanate dimethylcyclohexane or so; aromatic diisocyanates such as 4,4'-diphenylmethane diisocyanate, tolylene diisocyanate, xylylene diisocyanate, tolidine diisocyanate, tetramethylenexylylene diisocyanate, naphthalene-1,5-diisocyanate or so may be mentioned. Among these, isophorone diisocyanate, hexamethylene diisocyanate, and xylylene diisocyanate are preferably used because the viscosity of urethane (meth)acrylate oligomer can be maintained low, and good handling can be obtained.

The terminal isocyanate urethane prepolymer obtained from the above mentioned polyol compound and the polyvalent isocyanate compound is reacted with (meth)acrylate comprising the hydroxyl group, thereby urethane (meth)acrylate oligomer is obtained.

As (meth)acrylate comprising hydroxyl group, it is not particularly limited, as long as it is a compound comprising hydroxyl group and (meth)acryloyl group in one molecule; and those already known can be used. Specifically, hydroxyalkyl (meth)acrylate such as 2-hydroxyethyl (meth)acrylate, 2-hydroxypropyl (meth)acrylate, 4-hydroxybutyl (meth)acrylate, 4-hydroxycyclohexyl (meth)acrylate, 5-hydroxycyclooctyl (meth)acrylate, 2-hydroxy-3-phenyloxypropyl (meth)acrylate, pentaerythritol tri(meth)acrylate, polyethyleneglycol mono(meth)acrylate, polypropyleneglycol mono(meth)acrylate or so; hydroxyl group containing (meth)acrylic amide such as N-methylol (meth)acrylic amide or so; and the reaction product obtained by the reaction between diglycidyl ester of bisphenol A and (meth)acrylate or so may be mentioned.

As the condition for reacting the terminal isocyanate urethane prepolymer and hydroxyl group containing (meth)acrylate, these may be reacted under the presence of solvent and catalyst if needed, at the temperature of 60 to 100° C. or so, for 1 to 4 hours or so.

The obtained urethane (meth)acrylate oligomer comprises a photopolymerizable double bond in the molecule, and has a property which polymerize cures by the energy ray irradiation and forms the coating. The above mentioned urethane (meth)acrylate oligomer can be used alone or by mixing two or more thereof. The urethane (meth)acrylate oligomer may be monofunctional urethane (meth)acrylate oligomer which comprises one (meth)acryloyl group in the molecule, or it may be polyfunctional urethane (meth)acrylate oligomer which comprises two or more of (meth)acryloyl group in the molecule. However, polyfunctional urethane (meth)acrylate oligomer is preferable. As the urethane (meth)acrylate oligomer is the polyfunctional urethane (meth)acrylate oligomer, the weight average molecular weight of the urethane (meth)acrylate oligomer can be regulated easily as described in below, and thus the Young's modulus of the obtained base can be easily controlled. The number of (meth)acryloyl group comprised in the polyfunctional urethane (meth)acrylate oligomer is preferably 2 to 3, and 2 is more preferable (urethane (meth)acrylate oligomer is bifunctional urethane (meth)acrylate oligomer).

The weight average molecular weight of the urethane (meth)acrylate oligomer is not particularly limited (in terms of polystyrene by gel permeation chromatography, same applies hereinafter), however in case the urethane (meth)acrylate oligomer is the polyfunctional urethane (meth)acrylate oligomer, the weight average molecular weight is preferably 1500 to 10000 or so, and more preferably 4000 to 9000. By setting the weight average molecular weight to 1500 or more, the crosslinking density in the polymerized product of the urethane (meth)acrylate oligomer is suppressed from increasing, and the Young's modulus of the base can be easily regulated so that it does not exceed the upper limit of range which will be described in below. Also, by setting it to 10000 or less, the crosslinking density in the polymerized product of the urethane (meth)acrylate oligomer is suppressed from decreasing, and the Young's modulus of the base can be easily regulated so that it does not become lower than the lower limit of range which will be described in below. Also, the viscosity of the urethane (meth)acrylate oligomer can be lowered, and the handling property of the coating solution can be improved.

In case of using the above mentioned urethane (meth)acrylate resin, in many cases it is difficult to form the support film, hence usually the energy ray polymerizable monomer is diluted and formed into film, then cured thereby the support film is obtained. The energy ray polymerizable monomer comprises the energy ray polymerizable double bond in the molecule, particularly in the present invention, (meth)acrylic acid ester based compound comprising relatively bulky group is preferably used such as isobornyl (meth)acrylate, dicyclopentenyl (meth)acrylate, phenylhydroxypropyl (meth)acrylate or so.

The above mentioned energy ray polymerizable monomer is used in the ratio of 5 to 900 parts by weight, more preferably 10 to 500 parts by weight, and particularly preferably 30 to 200 parts by weight with respect to 100 parts by weight of urethane (meth)acrylate oligomer. When the blending amount of the energy ray polymerizable monomer is within such range, the copolymerized product between the urethane (meth)acrylate oligomer and energy ray polymerizable monomer will have appropriate degree of space between the part derived from the (meth)acryloyl group of the urethane (meth)acrylate oligomer, thus the Young's modulus of the base can be easily regulated within the range which will be described in below.

As the energy ray curable urethane resin, the energy ray curable resin comprising the urethane polymer and energy ray polymerizable monomer as the main component is used, and the support film obtained by curing the energy ray curable resin can be used as well.

The urethane polymer is different from the urethane (meth)acrylate oligomer, and it is the urethane based polymer which does not comprise the polymerizable functional group such as (meth)acryloyl group or so in the molecule; and for example it is obtained by reacting the above mentioned polyol compound and polyvalent isocyanate compound.

As the energy ray polymerizable monomer, the same one used for diluting the urethane (meth)acrylate resin can be used, and also nitrogen containing monomers such as N,N-dimethylaminoethyl acrylate, N,N-dimethylaminopropyl methacrylamide, acryloyl morpholine, N,N-dimethylacrylamide, N,N-diethylacrylamide, imide acrylate, N-vinylpyrrolidone or so may be used.

The above mentioned energy ray polymerizable monomer is used in the ratio preferably of 5 to 900 parts by weight, more preferably 10 to 500 parts by weight, and particularly preferably 30 to 200 parts by weight with respect to 100 parts by weight of urethane polymer.

In case of forming the support film from the above mentioned energy ray curable resin, by mixing the photopolymerization initiator in the resin, the polymerization curing time and the irradiation amount by the energy ray can be reduced. As the photopolymerization initiator, the same ones added to the curable resin (A) can be used.

The used amount of the photopolymerization imitator is preferably 0.05 to 15 parts by weight, more preferably 0.1 to 10 parts by weight, and particularly preferably 0.5 to 5 parts by weight with respect to 100 parts by weight of the energy ray curable resin.

Also, the above mentioned curable resin (B) may comprise additives for example, inorganic fillers such as calcium carbonate, silica and mica or so; metal fillers such as iron and lead or so; and coloring agent such as pigment and dye or so.

As the production method of the support film, the compound including the curable resin (B) in a liquid state is casted on the casting film to form a thin layer, then this is formed into a film by predetermined means, and the casting film is removed thereby the support film can be produced. According to such production method, the stress applied to the resin when forming the film can be made small, and the size change caused by aging and heat application less likely occurs. Also, the solid impurity can be easily removed, thus the produced film has less fish-eye formed, and thereby the uniformity of the film thickness is improved and the thickness precision is usually within 2%.

The thickness of the support film is preferably 40 to 300 µm, more preferably 60 to 250 µm, and particularly preferably 80 to 200 µm.

Further, at the face where the anti-static coat layer of the support film is formed or where the adhesive layer is provided, in order to improve the adhesiveness with these layers, other layer carried out with a corona treatment and primer treatment may be provided.

The support film produced by the above mentioned materials and method exhibits excellent stress relaxation property. For example, by using such support film having excellent stress relaxation property, the base used in the present invention exhibits excellent stress relaxation property. Specifically, the stress relaxation rate of the base after 1 minute of 10% stretch is 60% or more, preferably 65% or more, and more preferably 75 to 90%. By setting the stress relaxation rate of the base within the above range, the surface protective sheet of the present invention used for the base rapidly solves the residual stress generated when adhering to the adherend, and even when semiconductor wafer is ground extremely thin during the step of grinding the backside of the semiconductor wafer (the step of processing the semiconductor wafer), the semiconductor wafer is suppressed from curving. If the stress relaxation rate of the base is less than 60%, the semiconductor wafer curves due to the stress generated during the step of processing the semiconductor wafer.

Also, the Young's modulus is 100 to 2000 MPa, preferably 125 to 1500 MPa, more preferably 125 to 1000 MPa, and particularly preferably 125 to 700 MPa. If the anti-static coat layer is provided on the surface protective sheet, a crack (a rupture) may be generated to the anti-static coat layer during the backside grinding step of the wafer. Due to such crack, the conductivity in the plane direction of the anti-static coat layer is cut, and the effect of dispersing the release charge may decline. According to the surface protective sheet of the present invention, by having the Young's modulus of the base within the above mentioned range, the suitable resistance of the surface protective sheet against the tension can be provided, thus the crack of the anti-static coat layer is prevented, and the anti-static ability can be suppressed from decreasing. If the Young's modulus of the base is less than 100 MPa, the anti-static coat layer may crack, and the anti-static ability may decline. Also, if the Young's modulus of the base exceeds 2000 MPa, the stress relaxation rate of the base declines, and the base having the stress relaxation rate within the desired range becomes difficult to obtain, thus the effect of preventing the wafer from curving decreases.

[Adhesive Layer]

In the surface protective sheet of the present invention, the adhesive layer is formed on the anti-static coat layer or on the support film.

The type of the adhesive layer is not particularly limited as long as it has the appropriate re-releasable property against the wafer, and it can be formed by conventionally known various adhesive agents. As such adhesive agent, it is not particularly limited, and for example the adhesive agents such as rubber based, acrylic based, silicone based, urethane based, polyvinylether or so can be used. Also, the energy ray curable adhesive agent which is re-releasable by curing by energy ray irradiation, and the adhesive agent of heat foaming type and water swelling type can be used.

As the energy ray curable (ultraviolet ray curable, electron beam curable) adhesive agent, the ultraviolet ray curable adhesive agent is preferably used. The specific example of such energy ray curable adhesive agent is disclosed for example in JP Patent Application Laid Open No. S60-196956, and JP Patent Application Laid Open No. S60-223139. Also, the water swelling type adhesive agent disclosed for example in JP Patent Application Laid Open No. H05-77284 and JP Patent Application Laid Open No. H06-101455 is preferably used.

The thickness of the adhesive layer is not particularly limited, but preferably it is 5 to 300 µm, and more preferably 10 to 200 µm.

Note that, to the adhesive layer, the release sheet may be stacked prior to the use thereof for protecting the adhesive layer. The release sheet is not particularly limited, and the release sheet base treated with the release agent can be used. As the release sheet base, for example, the film made of resins such as polyethylene terephthalate, polybutylene terephthalate, polypropylene, polyethylene or so, or a foaming film thereof, the glassine paper, the coated paper, the laminate paper or so may be mentioned. As the release agent, the release agent of the silicone based, the fluorine based, and long chain alkyl group containing carbamate or so may be mentioned.

As the method of providing the adhesive layer to the base surface, the adhesive layer coated on the release sheet so to have a predetermined thickness may be transferred to the base surface, or the adhesive layer may be formed by directly coating on the base surface.

[Surface Protective Sheet]

The surface protective sheet is formed by having the adhesive layer on one side of the above mentioned base comprising the anti-static coat layer and the support film. The adhesive layer can be provided on the anti-static coat layer or on the support film. Note that, in FIG. 1, the adhesive layer 3 is formed on the support film 2.

The production method of the surface protective sheet is not particularly limited, however for example the production method comprises the step of obtaining the support film by coating and curing the compound including the curable resin (B) on the casting film, the step of forming the coat layer by coating the compound including the inorganic conductive filler and the curable resin (A) on the support film, and the step of forming the base by curing the coat layer. Then, by forming the adhesive layer on one face of the base, the surface protective sheet according to the present invention can be obtained. The base of the surface protective sheet obtained by the above mentioned production method is preferably formed by the step of forming the pre-cured layer by coating and pre-curing the compound including the curable resin (B) on the casting sheet, the step of forming the coat layer by coating the compound including the inorganic conductive filler and the curable resin (A) on the pre-cured layer, and the step of curing the pre-cured layer and the coat layer. That is, on the surface of the support film of pre-cured state, the coat layer which will become the anti-static coat layer is formed, and the support film and the anti-static coat layer are completely cured together, hence the anti-static coat layer and the support film have excellent adhesiveness, and also the anti-static ability can be enhanced.

Note that, in the production method of the above mentioned surface protective sheet, the curable resin (B) may be completely cured at the pre-curing stage. Such production method can also enhance the adhesiveness between the anti-static coat layer and the support film.

Also, as the method for producing the surface protective sheet, the anti-static coat layer and the support film may be formed into layer each separately then stacked, thereby the base can be obtained, and then the adhesive layer may be formed on the base.

[Wafer Backside Grinding Method]

The surface protective sheet of the present invention can be used for the processing of the semiconductor wafer as shown in below.

(Method for the Backside Grinding of the Wafer)

When grinding the backside of the wafer, as shown in FIG. 1, the surface protective sheet 10 is adhered on the circuit face of the semiconductor wafer 11 formed with the circuit 12 on the surface to protect the circuit face, while grinding the backside of the wafer by is ground grinder 20, thereby the wafer is made to have predetermined thickness.

Figure 2:
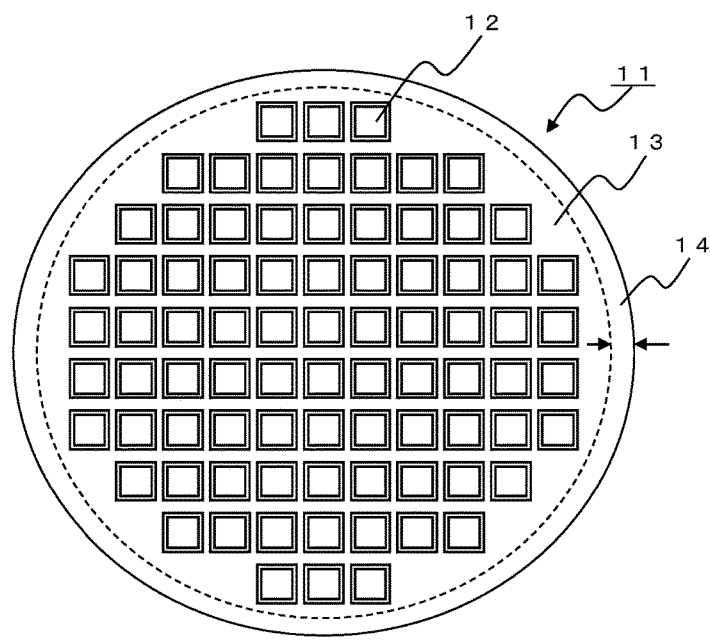
FIG. 2 is the planar view of the circuit forming face of the semiconductor wafer.

The semiconductor wafer may be a silicon wafer, or a compound wafer of gallium-arsenic or so. The circuit may be formed to the surface of the wafer by various methods which have been widely used conventionally such as etching method and lift-off method or so. In the circuit forming method of the semiconductor wafer, the predetermined circuit is formed. As shown in FIG. 2, the circuit 12 is formed in a lattice form on the surface of the inner peripheral part 13 of the wafer 11, and at the area of several mm from the outer peripheral end, the excess part 14 exist where the circuit is not formed. The thickness of such wafer before the grinding is not particularly limited; however it is usually 500 to 1000 µm or so.

During the backside grinding, as shown in FIG. 1, the surface protective sheet 10 is adhered on the circuit face to protect the circuit 12 on the wafer surface. The surface protective sheet is adhered on the wafer surface by widely used means such as a tape mounter or so. Also, the surface protective sheet 10 may be cut into approximately the same shape as the semiconductor wafer 11 in advance, and after adhering the sheet to the wafer, the excess sheet may be cut along the outer periphery of the wafer for removal.

The backside grinding of the wafer is carried out by the known means using the grinder 20 and the vacuum table (not shown in the figure) or so for fixing the wafer while the surface protective sheet 10 is adhered on the entire surface of the circuit. After the backside grinding step, the treatment for removing the fractured layer generated as a result of the grinding may be carried out. The thickness of the semiconductor wafer after the backside grinding is not particularly limited, but preferably it is 10 to 500 µm, and particularly preferably 25 to 300 µm or so.

After the backside grinding step, the surface protective sheet 10 is released from the circuit face. According to the surface protective sheet of the present invention, the surface protective sheet securely holds the wafer during the backside grinding of the wafer, and the infiltration of the grinding water to the circuit face can be prevented. Also, the static can be effectively dispersed which is generated by the release charge when releasing the sheet 10 from the wafer after the backside grinding is completed.

Then, after going through the steps of dicing of the wafer, mounting of chip, and resin sealing or so, the semiconductor device is obtained.

(Pre-Dicing Method)

Furthermore, the surface protective sheet of the present invention is particularly preferably used to form the chips of the wafer having a high bumps using so called pre-dicing method. Specifically, it is preferably used for the processing method of the semiconductor wafer including the forming of grooves having a depth of cut shallower than a wafer thickness from the surface of the semiconductor wafer formed with the circuit having bumps, adhering the surface protective sheet to the circuit formed face, thinning of the wafer thickness by the backside grinding of said semiconductor wafer, and dividing into individual chips.

Then, the chip is picked up by predetermined method. Also, prior to the pickup of the chip, the chip aligned in wafer shape may be transferred to other adhesive sheet, then the pickup of the chip may be carried out as well. According to the surface protective sheet of the present invention, the static can be effectively dispersed which is generated by the release charge when releasing the surface protective sheet from the chip.

EXAMPLE

Hereinafter, the present invention will be described based on the examples, however the present invention is not to be limited thereto. Note that, in the below examples and comparative examples, various physical properties were evaluated as shown in below.

<Young's Modulus of the Base>

The Young's modulus was measured using an universal tensile tester (TENSILON/RTA-T-2M manufactured by ORIENTEC Co., LTD.) in accordance with JIS K7161: 1994, under the condition of 23° C., the humidity 50%, and at the tensile speed of 200 mm/min.

<Stress Relaxation Rate of the Base>

The base used for the examples and the comparative examples was cut into a size having the width of 15 mm and the length of 100 mm, thereby the sample was obtained. This sample was stretched at the speed of 200 mm/min at room temperature (23° C.) using TENSILON RTA-100 manufactured by ORIENTEC Co., LTD. Then, stretching was stopped at 10% stretch, and from the stress "A" at that time and the stress "B" at 1 minute from the stretch termination, the stress relaxation rate was calculated based on the equation of the stress relaxation rate=(A−B)/A×100(%).

<Curving of the Wafer after the Grinding>

The surface protective sheet formed by the examples and the comparative examples was adhered on the silicon wafer (200 mmφ, thickness of 750 µm) using the tape mounter (Adwill RAD-3500 made by Lintec Corporation). Next, the wafer was ground by DFG-840 made by DISCO Corporation so that the thickness of the silicon wafer was 150 µm. The surface protective sheet was not removed after the grinding, the wafer was placed on the precision surface plate having the flatness of $1^{st}$ degree in accordance with JIS B 7513; 1992 so that the surface protective sheet was on the upper side.

For the measurement, the plate was defined zero point, and the measurements of 17 points were obtained. The curving value was obtained from the difference between the maximum value and the minimum value.

<Release Charge>

The surface protective sheet of the examples and comparative examples were adhered on the wafer circuit face, and the laminated body of the wafer and the surface protective sheet was obtained. The laminated body was left under the environment of average temperature of about 23°

C. and the average humidity of 65% RH for 30 days from the time the laminated body was formed. After leaving for 30 days, first the laminated body was cut into a square shape of 10×10 cm. Then, the surface protective sheet was released from the wafer at 500 mm/min. Here, the static potential charged to the surface protective sheet was measured from 50 mm apart therefrom using static volt meter (KSD-6110 made by KASUGA DENKI, Inc) under the environment of 23° C. and the humidity of 65% RH (the measurement lower limit was 0.1 kV).

<Crack of the Anti-Static Coat Layer>

The wafer was ground by the same method for the evaluation of the wafer curving after the grinding, then the surface protective sheet was released from the wafer, the anti-static coat layer face was observed by the digital microscope, thereby the crack of the anti-static coat layer was verified.

Example 1

The compound including, the mixture comprising 50 parts by weight of bifunctional urethane acrylate oligomer (the weight average molecular weight of 8000) wherein the backbone is the urethane oligomer made of isophorone diisocyanate and polyester type polyol having the molecular weight of 2000, 25 parts by weight of isobornyl acrylate as the acrylic monomer (the energy ray polymerizable monomer), and 25 parts by weight of 2-hydroxy-3-phenoxypropyl acrylate; and 1 parts by weight of Darocur 1173 (the product name made by BASF) was coated on the release film, then cured by ultraviolet ray thereby the support film having the thickness of 100 µm was obtained.

The compound blending 100 parts by weight of the epoxy acrylate based resin (the weight average molecular weight 2000), 230 parts by weight of antimony doped tinoxide (ATO) having the average particle diameter of 0.1 µm and 2 parts by weight of the photopolymerization initiator (IRGACUR 184 made by BASF) was obtained. This compound was coated on one face of the support film, then ultraviolet ray was irradiated thereby the anti-static coat layer having the thickness of 2 µm was obtained. Meanwhile, the opposite face of the face provided with the anti-static coat layer of the support film was coated with the ultraviolet ray curable adhesive agent so that the thickness was 20 µm, then the adhesive layer was provided thereby the surface protective sheet was made. Each evaluation result is shown in Table 1.

Example 2

The surface protective sheet was made as same as the example 1 except that the weight average molecular weight of the urethane acrylate oligomer was 3000 for production of the support film. Each evaluation result is shown in Table 1.

Example 3

The surface protective sheet was made as same as the example 1 except that the weight average molecular weight of the urethane acrylate oligomer was 6000 and the added amount of ATO was 400 parts by weight for production of the support film, and the thickness of the anti-static coat layer was 0.25 µm. Each evaluation result is shown in Table 1.

Example 4

The surface protective sheet was made as same as the example 1 except that the added amount of ATO was 150 parts by weight, and the thickness of the anti-static coat layer was 4.8 µm. Each evaluation result is shown in Table 1.

Comparative Example 1

The surface protective sheet was made as same as the example 1 except that the anti-static coat layer was not provided. Each evaluation result is shown in Table 1.

Comparative Example 2

The surface protective sheet was made as same as the example 1 except that the weight average molecular weight of the urethane acrylate oligomer was 12000 for production of the support film. Each evaluation result is shown in Table 1.

Comparative Example 3

The surface protective sheet was made as same as the example 1 except that the weight average molecular weight of the urethane acrylate oligomer was 900 for production of the support film. Each evaluation result is shown in Table 1.

TABLE 1

| | Base | | Anti-static coat layer | | | | |
|---|---|---|---|---|---|---|---|
| | Young's modulus (MPa) | Stress relaxation rate (%) | Thickness (µm) | Content of inorganic conductive filler (parts by weight) | Curving of wafer (mm) | Release charge (V) | Crack presence |
| Example 1 | 110 | 88 | 2 | 230 | 0 | 30 | NONE |
| Example 2 | 1800 | 65 | 2 | 230 | 5 | 40 | NONE |
| Example 3 | 140 | 85 | 0.25 | 400 | 0 | 150 | NONE |
| Example 4 | 140 | 85 | 4.8 | 150 | 1 | 25 | NONE |
| Comparative example 1 | 140 | 85 | 0 | — | 0 | 5500 | — |
| Comparative example 2 | 80 | 90 | 2 | 230 | 0 | 900 | Present |
| Comparative example 3 | 2200 | 50 | 2 | 230 | 25 | 50 | NONE |

NUMERICAL REFERENCES

1 . . . Anti-static coat layer
2 . . . Support film

3 . . . Adhesive layer
5 . . . Base
10 . . . Surface protective sheet

The invention claimed is:

1. A surface protective sheet used for a backside grinding of a semiconductor wafer formed with a circuit on a surface, wherein said surface protective sheet comprises:
an adhesive layer, and
a base comprising a support film and an anti-static coat layer including an inorganic conductive filler and a cured product of a curable resin (A),
wherein a stress relaxation rate of the base after 1 minute of 10% stretch is 60% or more, and a Young's modulus of the base is 100 to 2000 MPa.

2. The surface protective sheet as set forth in claim 1, wherein the anti-static coat layer comprises 150 to 600 parts by weight of the inorganic conductive filler with respect to 100 parts by weight of the cured product of the curable resin (A).

3. The surface protective sheet as set forth in claim 1, wherein the support film includes a cured product of a curable resin (B).

4. The surface protective sheet as set forth in claim 3, wherein the curable resin (B) is an energy ray curable urethane resin.

5. The surface protective sheet as set forth in claim 1, wherein said surface protective sheet comprises the adhesive layer, the support film, and the anti-static coat layer laminated in this order.

6. The surface protective sheet as set forth in claim 5, wherein said inorganic conductive filler comprises a tin oxide.

7. The surface protective sheet as set forth in claim 5, wherein said support film comprises a urethane (meth) acrylate resin.

8. The surface protective sheet as set forth in claim 1, wherein a thickness of the anti-static coat layer is 0.2 to 5 µm.

9. The surface protective sheet as set forth in claim 1, wherein said inorganic conductive filler comprises an antimony-doped tin oxide.

10. The surface protective sheet as set forth in claim 1, wherein said inorganic conductive filler comprises a phosphorous-doped tin oxide.

11. A surface protective sheet, comprising:
a base comprising:
1) an anti-static coat layer comprising an inorganic conductive filler and a cured product of a curable resin, and
2) a support film on the anti-static coat layer, wherein a stress relaxation rate of the base after 1 minute of 10% stretch is 60% or more, and a Young's modulus of the base is 100 to 2000 MPa; and
an adhesive layer on the support film.

* * * * *